(12) United States Patent
Akahane et al.

(10) Patent No.: US 12,412,828 B2
(45) Date of Patent: Sep. 9, 2025

(54) ELECTRONIC COMPONENT

(71) Applicant: KOA CORPORATION, Ina (JP)

(72) Inventors: Yasushi Akahane, Ina (JP); Nobuhiko Tamada, Ina (JP)

(73) Assignee: KOA CORPORATION, Ina (JP)

( * ) Notice: Subject to any disclaimer, the term of this patent is extended or adjusted under 35 U.S.C. 154(b) by 478 days.

(21) Appl. No.: 17/911,824

(22) PCT Filed: Feb. 26, 2021

(86) PCT No.: PCT/JP2021/007335
§ 371 (c)(1),
(2) Date: Sep. 15, 2022

(87) PCT Pub. No.: WO2021/205573
PCT Pub. Date: Oct. 14, 2021

(65) Prior Publication Data
US 2023/0144364 A1    May 11, 2023

(30) Foreign Application Priority Data

Apr. 8, 2020  (JP) .................................. 2020-069703

(51) Int. Cl.
*H01L 23/48* (2006.01)
*H01L 23/498* (2006.01)

(52) U.S. Cl.
CPC .. *H01L 23/49883* (2013.01); *H01L 23/49822* (2013.01)

(58) Field of Classification Search
None
See application file for complete search history.

(56) References Cited

U.S. PATENT DOCUMENTS

| | | | | |
|---|---|---|---|---|
| 7,969,710 B2* | 6/2011 | Choi | ..................... | H01G 9/012 |
| | | | | 361/538 |
| 12,112,869 B2* | 10/2024 | Sakakibara | ............ | H05K 1/181 |
| 2002/0121709 A1* | 9/2002 | Matsuki | ............ | H01L 23/49811 |
| | | | | 257/784 |

FOREIGN PATENT DOCUMENTS

| | | |
|---|---|---|
| CN | 101840760 A | 9/2010 |
| JP | S58-107605 A | 6/1983 |
| JP | H07-230904 A | 8/1995 |

(Continued)

OTHER PUBLICATIONS

May 18, 2021 International Search Report issued in Patent Application No. PCT/JP2021/007335.

(Continued)

*Primary Examiner* — Nicholas J Tobergte
(74) *Attorney, Agent, or Firm* — Oliff PLC (57) ABSTRACT

A chip resistor comprises an insulating substrate (component body) on which a resistor is formed, a connection terminal (front electrodes, end face electrodes, and back electrodes) formed at both end portions of the insulating substrate, an under layer formed by electrolytic plating to cover the connection terminal, a barrier layer formed by electrolytic plating to cover the under layer, and an external connection layer which is mainly composed of tin and formed on a surface of the barrier layer, wherein the barrier layer is made of alloy plating mainly composed of nickel and containing 3% to 15% of phosphorus, and the under layer is formed of a copper plated layer that is at least either more malleable or more ductile than the barrier layer.

2 Claims, 4 Drawing Sheets

(56) References Cited

FOREIGN PATENT DOCUMENTS

| | | | |
|---|---|---|---|
| JP | H11-067588 | A | 3/1999 |
| JP | 2001-210545 | A | 8/2001 |
| JP | 2001-274539 | A | 10/2001 |
| JP | 2003045702 | A * | 2/2003 |

OTHER PUBLICATIONS

Jul. 2, 2024 Office Action issued in Chinese Patent Application No. 202180019980.8.

* cited by examiner

ELECTRONIC COMPONENT

TECHNICAL FIELD

The present invention relates to an electronic component such as a chip component, a connector, etc., and more particularly, relates to an electrode terminal structure for soldering formed on a component body of the electronic component.

BACKGROUND ART

In order to mount an electronic component such as a chip component, a connector, etc. on a circuit board, a plated layer made of Sn (tin) or Sn—Pb (lead) is formed in advance, as an external connection layer, on a surface of a connection terminal provided on a component body of the electronic component, and then this external connection layer is bonded to a land of a wiring pattern provided on the circuit board by using a solder material. For example, in the case of a surface mount component for soldering external connection layers formed on both end portions of the component body such as a chip resistor, after the solder paste (solder material) is applied to lands of a wiring pattern, the electronic component is placed on the circuit board such that the external connection layers overlap the solder paste. In this state, the plated layers of the external connection layers and the solder paste are melted by heat of a reflow furnace, and then the solder paste is cooled and solidified to so as to connect the connection terminal and the lands. Furthermore, in the case of a lead component for soldering a pin-shaped connection terminal protruding from the component body such as a connector, after the connection terminal is inserted into a through hole of a circuit board, an external connection layer (plated layer) of the connection terminal and the solder material are melted by heat of a solder iron and the like, and then the solder material is cooled and solidified so as to connect the connection terminal and the land.

As the solder material used for mounting the electronic component on the circuit board, for example, a material called eutectic solder in which tin (Sn) and lead (Pb) are mixed at a ratio of about 6:4 (Sn63%-Pb37%) is used. Although the melting point of the eutectic solder having such a composition is 183° C., in order to melt the solder, it is necessary to apply heat at the melting point or higher. Accordingly, a phenomenon that Ag and Cu forming the connection terminal melt toward the solder material side due to the heat during soldering, which is so-called "solder leaching", may be caused. In order to prevent the solder leaching, a barrier layer is provided. Conventionally, there has been proposed an electrode terminal structure including the barrier layer composed of nickel or lead provided between the connection terminal and the external connection layer of the electronic component in order to prevent the solder leaching (for example, see Patent Literature 1).

CITATION LIST

Patent Literature

Patent Literature 1: JP-A-2001-210545

SUMMARY OF INVENTION

Technical Problem

In recent years, lead free has been recommended in respect of global environmental protection, and thus a material which is called lead-free solder containing almost no lead has been used. Here, for example, in the case of using the lead-free solder having the composition of Sn96.5%-Ag3%-Cu0.5%, the melting point of this lead-free solder is 220° C. and the heating temperature during soldering is higher as compared with the case of using the eutectic solder. Accordingly, the barrier layer even formed of nickel cannot function sufficiently as a barrier layer since nickel is likely to diffuse toward the solder material side. In this regard, it is necessary to delay the solder leaching by increasing the thickness of the nickel plated layer, however, forming the plated layer so thick may not only cause cracks due to the external stress and internal stress, but also increase the plating time and material cost.

In the automobile industry, technologies such as automatic driving devices and safety devices have been rapidly improved in recent years, and thus the number of electronic components mounted thereon has rapidly increased. The electronic components mounted on automobiles are required to have higher reliability than consumer components, and moreover, the use environment thereof is severe. In particular, the electronic components mounted on automobiles need to have high heat resistance so that they can be used even under an environment around 200° C. without causing any problem. However, when the electronic components are used in a high-temperature environment close to 200° C., the nickel plated layer forming the barrier layer diffuses toward the surface, whereby it cannot function as a barrier layer. That is, in the conventional electrode terminal structure, the sufficient heat resistance is difficult to be obtained not only during solder mounting but also under a use environment.

The present invention has been made in view of the circumstances of the prior art, and an object thereof is to provide an electronic component having a terminal electrode structure capable of obtaining sufficient heat resistance during solder mounting and under a use environment.

Solution to Problem

In order to achieve the object above, the present invention provides an electronic component comprising: a component body; a connection terminal formed on the component body; an under layer formed by electrolytic plating so as to cover the connection terminal; a barrier layer formed by electrolytic plating so as to cover the under layer; and an external connection layer which is mainly composed of tin and formed on a surface of the barrier layer, wherein the barrier layer is made of alloy plating in which 3% to 15% of phosphorus is added to nickel, and the under layer is a metal layer that is at least either more malleable or more ductile than the barrier layer.

In the electronic component having the structure described above, the barrier layer covered by the external connection layer is made of alloy (Ni—P) plating mainly composed of nickel (Ni) and containing 3% to 15% of phosphorus (P). Applying this alloy plating results in slower diffusion toward tin than using nickel, and accordingly, it is possible to obtain sufficient heat resistance during solder mounting or in a use environment even without forming the barrier layer so thick. Furthermore, since the metal layer that is at least either more malleable or more ductile than the barrier layer is formed as an under layer of the barrier layer, even if the internal stress increases due to addition of phosphorus to nickel, the stress can be relaxed by this under layer, thereby making it possible to suppress cracks from being formed.

In the electronic component having the structure described above, the under layer may be gold, silver, platinum, or an alloy containing either of them as a main component as long as it is formed as a metal layer that is at least either more malleable or more ductile than the barrier layer, however, using copper or an alloy containing copper as a main component is preferable in terms of cost.

In the electronic component having the structure described above, the under layer having insufficient film thickness causes insufficient exhibition of effect of stress relaxation, while the under layer formed so thick causes deterioration of cost and productivity. Accordingly, the thickness of the under layer is, preferably, 3 µm to 25 µm.

In the electronic component having the structure described above, in the case that the magnetic layer is formed between the connection terminal and the barrier layer, using the magnetic properties of the magnetic layer enables, for example, stabilizing of a position of a product in a taping process for storing the product in a tape-like package or when taking out the product from a package and mounting it on a circuit board.

Advantageous Effects of Invention

According to an electronic component of the present invention, it is possible to realize a terminal electrode structure capable of obtaining sufficient heat resistance during solder mounting and under a use environment, and also suppress cracks from being formed.

DESCRIPTION OF EMBODIMENTS

Figure 1:
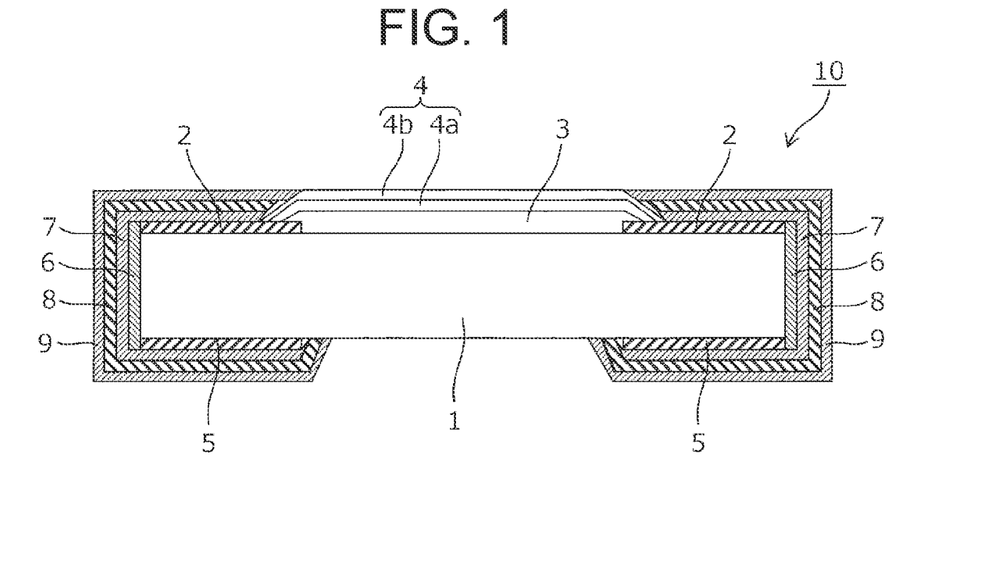
FIG. 1 is a cross-sectional view of a chip resistor according to a first embodiment of the present invention.

Hereinafter, embodiments of the present invention will be described with reference to the drawings. FIG. 1 is a cross-sectional view of a chip resistor according to a first embodiment of the present invention.

As illustrated in FIG. 1, a chip resistor 10, which is an example of an electronic component, mainly includes a rectangular parallelepiped insulating substrate 1, a pair of front electrodes 2 formed at both end portions in the longitudinal direction on a surface of the insulating substrate 1, a resistor 3 formed so as to bridge between the pair of front electrodes 2, a protective layer 4 covering the entire of the resistor 3 and a portion of the front electrodes 2, a pair of back electrodes 5 formed at both end portions in the longitudinal direction on the back surface of the insulating substrate 1, a pair of end face electrodes 6 formed on both end faces in the longitudinal direction of the insulating substrate 1, each of which conducts between the corresponding one of the front electrodes 2 and the corresponding one of the back electrodes 5, a pair of under layers 7 each of which covers the corresponding one of the front electrodes 2, the corresponding one of the back electrodes 5, and the corresponding one of the end face electrodes 6, a pair of barrier layers 8 each of which covers the corresponding one of the under layers 7, and a pair of external connection layers 9 each of which covers the corresponding one of the barrier layers 8.

The insulating substrate 1 is a component body formed of ceramics and the like. A large-sized substrate, which will be described later, is divided into a plurality of pieces along a vertically extending groove and a horizontally extending groove, whereby the insulating substrate 1 is obtained.

The pair of front electrodes 2 is formed on the opposite short sides of the insulating substrate 1 with a predetermined interval therebetween. The pair of front electrodes 2 is obtained by screen-printing the Ag paste and drying and firing the printed paste.

The resistor 3 is obtained by screen-printing the resistive paste such as ruthenium oxide and drying and firing the printed paste. Both end portions of the resistor 3 overlap the front electrodes 2. A trimming groove (not illustrated) is formed in the resistor 3, thereby adjusting a resistance value of the resistor 3.

The protective layer 4 is composed of a double layer structure including an undercoat layer 4a and an overcoat layer 4b. The undercoat layer 4a is obtained by screen-printing and firing the glass paste, and is formed so as to cover the resistor 3 before the trimming groove is formed. The overcoat layer 4b is obtained by screen-printing the epoxy resin paste and heating and curing the printed paste, and is formed, after the trimming groove is formed on the resistor 3 from above the undercoat layer 4a, so as to cover, as a whole, the resistor 3 including the trimming groove, and the undercoat layer 4a.

The back electrodes 5 are formed on the back surface of the insulating substrate 1 at positions corresponding to the positions of the front electrodes 2 with a predetermined interval therebetween. The pair of back electrodes 5 is obtained by screen-printing the Ag paste and drying and firing the printed paste.

The pair of end face electrodes 6 is obtained by sputtering Ni—Cr on the end faces of the insulating substrate 1, or applying the Ag paste on the end faces of the insulating substrate 1 and heating and curing the applied paste. Each of the end face electrodes 6 is formed so as to conduct the corresponding one of the front electrodes 2 and the corresponding one of the back electrodes 5. The corresponding one of the front electrodes 2, the corresponding one of the end face electrodes 6, and the corresponding one of the back electrodes 5 constitute a connection terminal having a U-shaped cross section.

The pair of under layers 7 is a copper plated layer formed by electrolytic plating so as to cover the connection terminals. Forming the under layers 7 enables relaxation of the internal stress caused by formation of the barrier layers 8 by plating performed in the later process. Here, the under layers 7 having insufficient film thickness cause insufficient exhibition of effect of stress relaxation, while the under layers 7 formed so thick cause deterioration of cost and productivity. Accordingly, the film thickness of the under layers 7 is set in the range of 3 µm to 25 µm. The under layers 7 may be gold, silver, platinum, or an alloy containing either of them as a main component as long as they are formed as metal layers that are at least either more malleable or more ductile than the barrier layers 8, however, using copper or an alloy containing copper as a main component is more advantageous in terms of cost as compared to using the metals described above. Thus, in the present embodiment, layers formed of copper or an alloy containing copper as a main component are used.

The pair of barrier layers 8 is an alloy-plated layer (Ni—P plated layer) composed of mainly nickel (Ni) and containing phosphorus (P), which is formed by electrolytic plating so as to cover the under layers 7. The thickness of the barrier layers 8 is set in the range from 2 μm to 15 μm. Here, in the alloy plated layers forming the barrier layers 8, the more nickel contains phosphorus, the more diffusion toward the tin-plated layers forming the external connection layers 9 can be suppressed, while nickel having an insufficient content of phosphorus causes insufficient exhibition of effect of diffusion suppression. However, too much content of phosphorus increases the internal stress such that it cannot be relaxed even if providing the under layers 7. Accordingly, the content rate of phosphorus with respect to nickel in the barrier layer 8 is set in the range of 3% to 15%.

The pair of external connection layers 9 is a tin (Sn) plated layer formed by electrolytic plating so as to cover the barrier layers 8, and the thickness thereof is set in the range of 2 μm to 15 μm.

Next, a method of producing the chip resistor 10 having the structure described above will be described with reference to FIG. 2A to 2F.

Firstly, a large-sized substrate from which a plurality of pieces of insulating substrates 1 can be obtained is prepared. In the large-sized substrate, the primary division groove and the secondary division groove are provided in advance to form a grid pattern, and each one of the grids divided by the primary division groove and the secondary division groove serves as a single chip region. FIG. 2A to 2F illustrate a large-sized substrate 10A corresponding to a single chip region as a representative example, but practically, each process which will be described below is collectively performed with respect to the large-sized substrate corresponding to a plurality of pieces of chip regions.

Figure 2A:
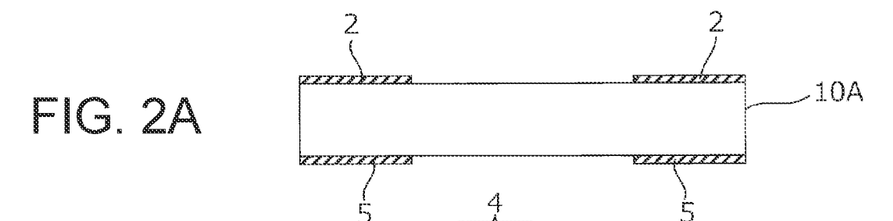
FIG. 2A to 2F are a cross-sectional view illustrating producing processes of the chip resistor.

That is, as illustrated in FIG. 2A, the Ag—Pd paste is screen-printed on a surface of the large-sized substrate 10A and then dried so as to form the pair of front electrodes 2, which faces each other with a predetermined interval therebetween, at both end portions in the longitudinal direction of each chip forming region. At the same time or around the same time, the Ag paste is screen-printed on the back surface of the large-sized substrate 10A and then dried so as to form the pair of back electrodes 5, which faces each other with a predetermined interval therebetween, at both end portions in the longitudinal direction of each chip forming region.

Figures 2B, 2C:
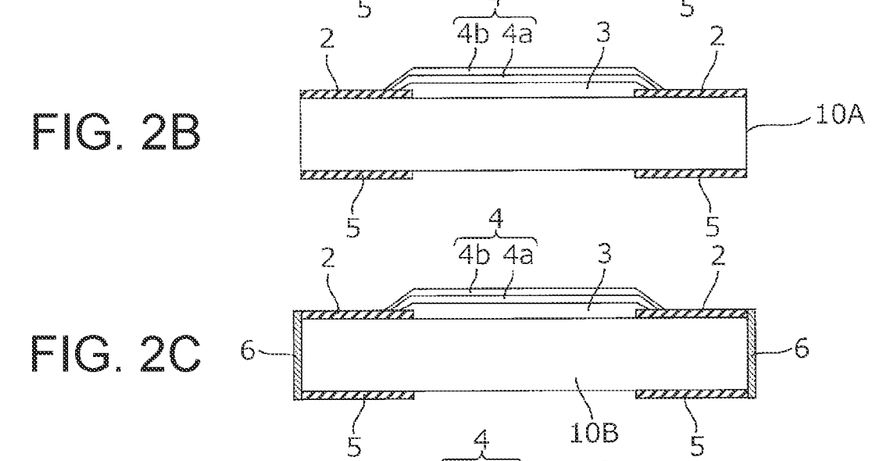

Next, as illustrated in FIG. 2B, the resistive paste containing ruthenium oxide or the like is screen-printed on the surface of the large-sized substrate 10A and then dried so as to form the resistor 3 whose both end portions overlap the front electrodes 2. Thereafter, the resistor 3 is fired at a high temperature of about 850° C. Next, the glass paste is screen-printed on an area covering the resistor 3 and then dried so as to form the undercoat layer 4a covering the resistor 3. Thereafter, the undercoat layer 4a is fired at a temperature of about 600° C. Next, a laser beam is irradiated from above the undercoat layer 4a so as to form a trimming groove (not illustrated) on the resistor 3, whereby a resistance value is adjusted. Thereafter, the epoxy-based resin paste is screen-printed from above the undercoat layer 4a, and then heated and cured at a temperature of about 200° C. so as to form the overcoat layer 4b. Thus, the protective layer 4 that is composed of a double layer structure including the undercoat layer 4a and the overcoat layer 4b is formed.

Next, the large-sized substrate 10A is primary-divided along the primary division groove to obtain a strip-shaped substrate 10B, then Ni/Cr is applied on the divided faces of the strip-shaped substrate 10B by sputtering. Thus, as illustrated in FIG. 2C, the end face electrodes 6 for connecting between the front electrodes 2 and the back electrodes 5 which are provided on both the front and back surfaces of the strip-shaped substrate 10B are formed. Note that the end face electrodes 6 may be formed by, instead of performing Ni/Cr sputtering, applying the Ag paste and heating and curing the applied paste.

Figures 2D, 2E, 2F:
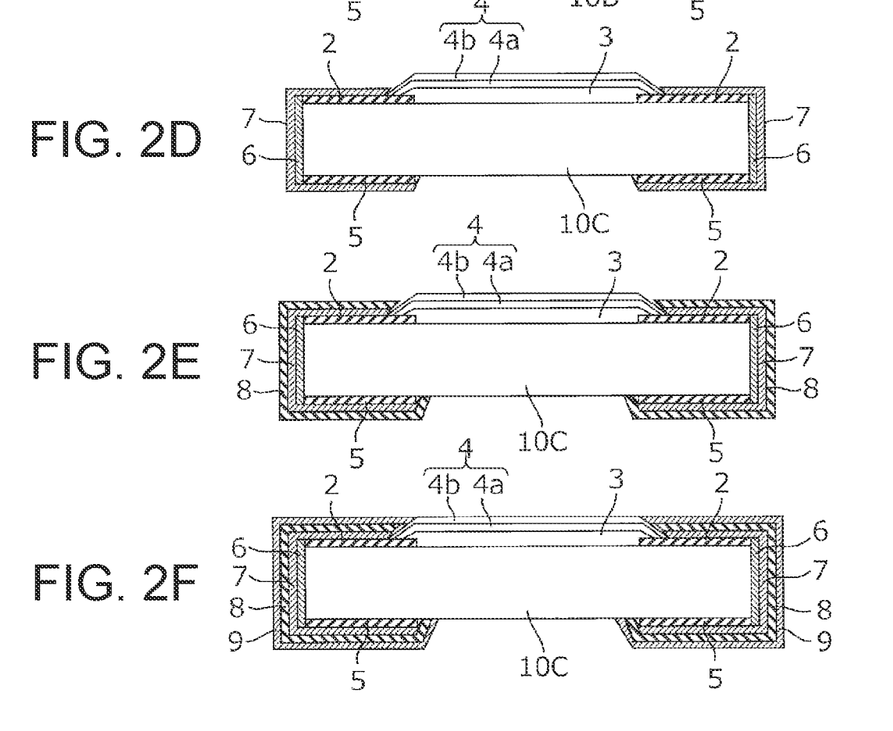

Next, the strip-shaped substrate 10B is secondary-divided along the secondary division groove to obtain a plurality of chip-shaped substrates 10C, and then electrolytic plating is applied on these chip-shaped substrates 10C. Thus, as illustrated in FIG. 2D, the under layers 7 covering the connection terminals (front electrodes 2, end face electrodes 6, and back electrodes 5) are formed at both end portions of each of the chip-shaped substrates 10C. The under layers 7 are formed of copper plated layers, and the film thickness thereof is set in the range of 3 μm to 25 μm (10 μm in the present embodiment).

Next, electrolytic plating is applied on the chip-shaped substrates 10C, whereby, as illustrated in FIG. 2E, the barrier layers 8 covering the under layers 7 are formed. The barrier layers 8 are formed of alloy plated layers (Ni—P plated layers) comprising nickel (Ni) as a main component and containing phosphorus (P), and the thickness thereof is set in the range of 2 μm to 15 μm (5 μm in the present embodiment). The content rate of phosphorus relative to nickel in the barrier layers 8 is set in the range of 3% to 15% (5% in the present embodiment), and thus even if the internal stress is caused due to addition of phosphorus into nickel, the stress is relaxed by the under layers 7.

Next, electrolytic plating is applied on the chip-shaped substrates 10C, whereby, as illustrated in FIG. 2F, the external connection layers 9 covering the surfaces of the barrier layers 8 are formed. The external connection layers 9 are Sn plated layers mainly composed of tin (Sn), and the thickness thereof is set in the range of 2 μm~15 μm. In this way, a terminal electrode structure including the barrier layers 8, the external connection layers 9, etc., thus exceling in heat resistance, is formed, and as a result, the chip resistor 10 illustrated in FIG. 1 can be obtained.

As described above, in the chip resistor 10 according to the first embodiment, the barrier layers 8 covered by the external connection layers 9 formed by tin plating are formed by alloy (Ni—P) plating mainly composed of nickel (Ni) and containing 3% to 15% of phosphorus (P). Applying this alloy plating results in slower diffusion toward tin than using nickel, and accordingly, it is possible to obtain sufficient heat resistance during solder mounting or in the use environment even without forming the barrier layers 8 so thick. Furthermore, since the copper plated layers are formed by electrolytic plating as the under layers 7 of the barrier layers 8, even if the internal stress increases due to addition of phosphorus to nickel, the stress can be relaxed by the under layers 7, thereby making it possible to suppress cracks caused by the internal stress.

Furthermore, the under layers 7, the barrier layers 8, and the external connection layers 9 are formed by electrolytic plating so as to be dense films. This enables maximizing of the characteristics (stress relaxation, barrier function, solderability) of each of the layers and also realizes a series of plating operations. Thus, it is possible to obtain the adhesion at the boundaries between layers and also the productivity while preventing corrosion due to an environment during the plating processes of forming each of the layers as much as possible.

Figure 3:
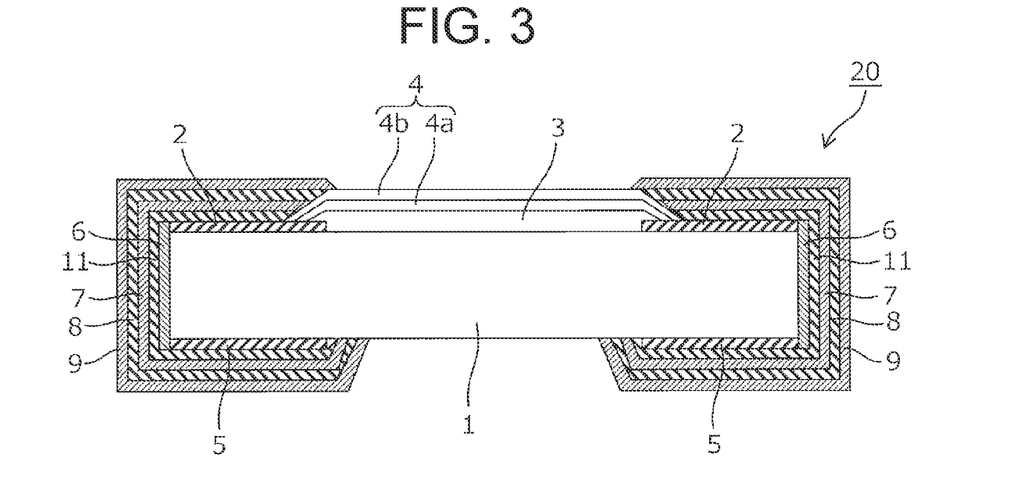
FIG. 3 is a cross-sectional view of a chip resistor according to a second embodiment of the present invention.

FIG. 3 is a cross-sectional view of a chip resistor 20 according to a second embodiment of the present invention.

The chip resistor 20 according to the second embodiment is basically the same as the chip resistor 10 according to the first embodiment, but is different therefrom in that magnetic layers 11 are formed between the connection terminals (front electrodes 2, end face electrodes 6, and back electrodes 5) and the barrier layers 8.

That is, as illustrated in FIG. 3, the chip resistor 20 mainly includes a rectangular parallelepiped insulating substrate 1, the pair of front electrodes 2 formed at both end portions in the longitudinal direction on a surface of the insulating substrate 1, the resistor 3 formed so as to bridge between the pair of front electrodes 2, the protective layer 4 covering the entire of the resistor 3 and a portion of the front electrodes 2, the pair of back electrodes 5 formed at both end portions in the longitudinal direction on the back surface of the insulating substrate 1, the pair of end face electrodes 6 formed on both end faces in the longitudinal direction of the insulating substrate 1, each of which conducts between the corresponding one of the front electrodes 2 and the corresponding one of the back electrodes 5, a pair of under layers 11 each of which covers the corresponding one of the front electrodes 2, the corresponding one of the back electrodes 5, and the corresponding one of the end face electrodes 6, the pair of under layers 7 each of which covers the corresponding one of the magnetic layers 11, the pair of barrier layers 8 each of which covers the corresponding one of the under layers 7, and the pair of external connection layers 9 each of which covers the corresponding one of the barrier layers 8.

The pair of magnetic layers 11 is a nickel (Ni) plated layer formed by electrolytic plating so as to cover the connection terminals, and the thickness thereof is set in the range of 2 μm to 15 μm. Providing the magnetic layers 11 can enhance the magnetic properties of the barrier layers 8 which have been reduced due to addition of phosphorus to nickel. The magnetic layers 11 may be formed between the under layers 7 and the barrier layers 8. Other than being provided with the magnetic layers 11, the structure according to the second embodiment is the same as that of the first embodiment, and accordingly, the components thereof are designated by the same reference signs as provided in FIG. 1 will not be described again.

Next, a method of producing the chip resistor 20 having the structure described above will be explained with reference to cross-sectional views illustrated in FIG. 4A to 4E. Note that, in the producing processes illustrated in FIG. 4A to 4E, FIG. 4A corresponds to FIG. 2C of the first embodiment, and the processes therebefore are the same as those of the first embodiment.

Figure 4A:
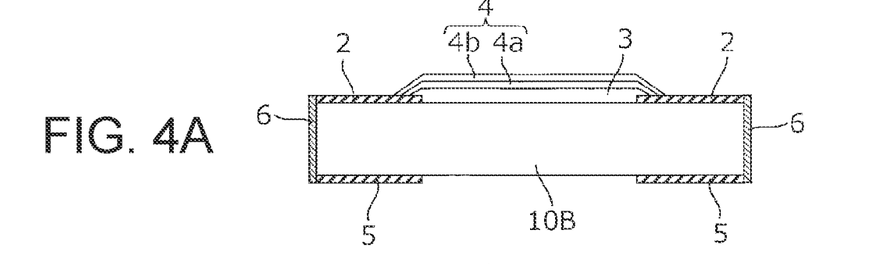
FIG. 4A to 4E are a cross-sectional view illustrating producing processes of the chip resistor.

That is, after the front electrodes 2, the resistor 3, the protective layer 4 (undercoat layer 4a and overcoat layer 4b), and the back electrodes 5 are formed on a large-sized substrate (not illustrated), Ni/Cr is deposited by sputtering on the divided faces of the strip-shaped substrate 10B obtained by primary-dividing the large-sized substrate. Thus, as illustrated in FIG. 4A, the end face electrodes 6 for connecting the front electrodes and the back electrodes, which are provided on the front and back surfaces of the strip-shaped substrate 10B are formed.

Figure 4B:
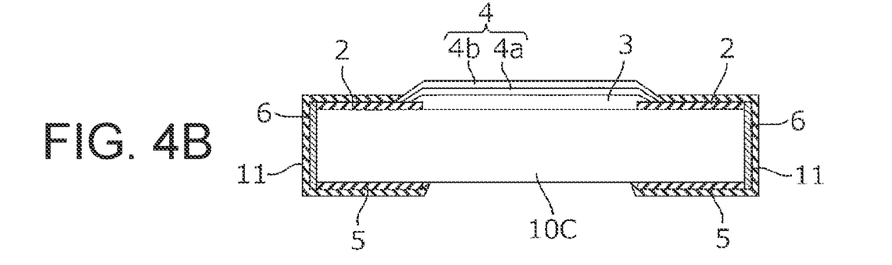

Next, after the strip-shaped substrate 10B is secondary-divided along the secondary division groove to obtain a plurality of chip-shaped substrates 10C, electrolytic plating is applied on each of the chip-shaped substrates 10C. Thus, as illustrated in FIG. 4B, the magnetic layers 11 covering the connection terminals (front electrodes 2, end face electrodes 6, and back electrodes 5) are formed on both end portions of each of the chip-shaped substrate 10C. The magnetic layers 11 are formed of a nickel (Ni) plated layer, and the thickness thereof is set in the range of 2 μm to 15 μm (5 μm in the present embodiment).

Figure 4C:
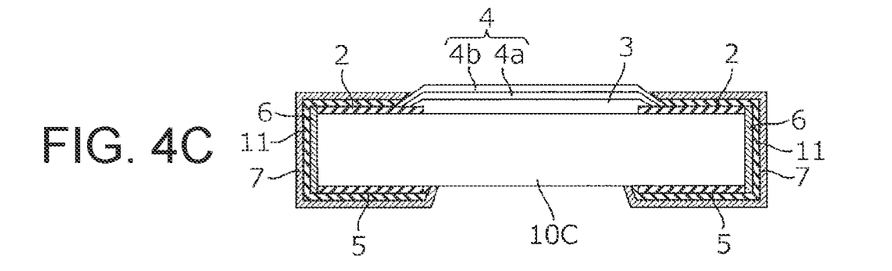

Next, electrolytic plating is applied to each of the chip-shaped substrates 10C, whereby, as illustrated in FIG. 4C, the under layers 7 covering the magnetic layers 11 are formed at both end portions of each of the chip-shaped substrates 10C. The under layers 7 are formed of copper plated layers, and the film thickness thereof is set in the range of 3 μm to 25 μm (10 μm in the present embodiment).

Figure 4D:
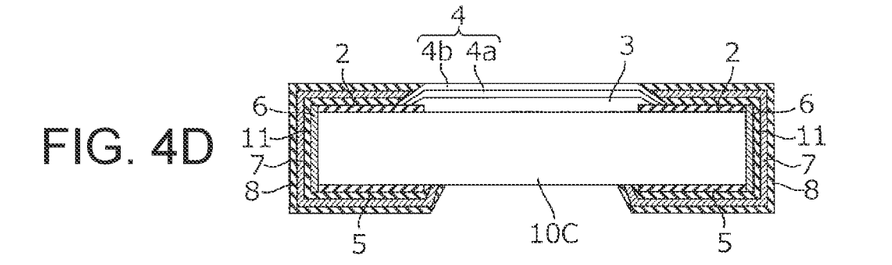

Next, electrolytic plating is applied to each of the chip-shaped substrates 10C, whereby, as illustrated in FIG. 4D, the barrier layers 8 covering the under layers 7 are formed. The barrier layers 8 are formed of alloy-plating layers (Ni—P plated layers) mainly composed of nickel (Ni) and containing phosphorus (P), and the thickness thereof is set in the range from 2 μm to 15 μm (5 μm in the present embodiment). Furthermore, the content rate of phosphorus with respect to nickel in the barrier layers 8 is set in the range of 3% to 15% (5% in the present embodiment).

Figure 4E:
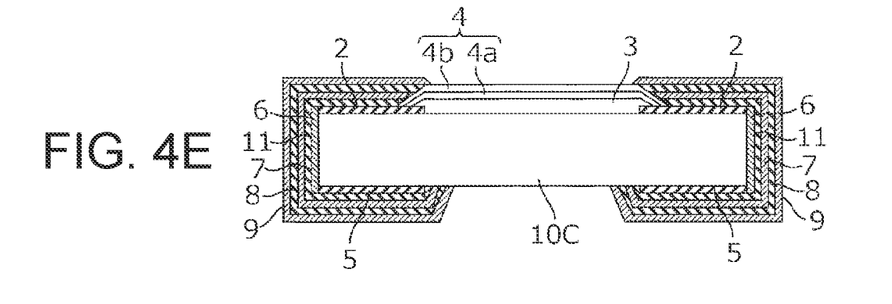

Next, electrolytic plating is applied to each of the chip-shaped substrates 10C, whereby, as illustrated in FIG. 4E, the external connection layers 9 covering surfaces of the barrier layers 8 are formed. The external connection layers 9 are Sn plated layers mainly composed of tin (Sn), and the thickness thereof is set in the range of 2 μm to 15 μm. In this way, a terminal electrode structure including the barrier layers 8, the external connection layers 9, etc., thus exceling in heat resistance, is formed, and as a result, the chip resistor 20 illustrated in FIG. 3 can be obtained.

As described above, in the chip resistor 20 according to the second embodiment, the magnetic layers 11 formed of nickel plated layers are formed between the connection terminals (front electrodes 2, end face electrodes 6, and back electrodes 5) and the barrier layers 8. Accordingly, using the magnetic properties of the magnetic layers 11 enables, for example, stabilizing of a position of a product in a taping process for storing the product in a tape-like package or when taking out the product from a package and mounting it on a circuit board.

In the chip resistor 20 according to the second embodiment, the magnetic layers 11 are formed between the connection terminals (front electrodes 2, end face electrodes 6, and back electrodes 5) and the under layers 7, meanwhile, the present invention is not limited thereto as long as the magnetic layers 11 are formed between the connection terminals and the barrier layers 8. That is, the magnetic layers 11 may be formed between the under layers 7 and the barrier layers 8, or the magnetic layers 11 may be formed both between the connection terminals and the under layers 7 and between the under layers 7 and the barrier layers 8.

Furthermore, in each of the embodiments described above, the case that the present invention is applied to the chip resistors which are examples of a surface mount component has been described, meanwhile, the present invention can also be applied to electronic components other than chip resistors, for example, a lead component having a pin-shaped connection terminal such as a connector.

REFERENCE SIGNS LIST 1 insulating substrate (component body)
2 front electrode (connection terminal)
3 resistor
4 protective layer
4a undercoat layer
4b overcoat layer

5 back electrode (connection terminal)
6 end face electrode (connection terminal)
7 under layer
8 barrier layer
9 external connection layer
10 chip resistor (electronic component)
11 magnetic layer

The invention claimed is:

1. An electronic component comprising:
    a component body;
    a connection terminal formed on the component body;
    an under layer formed directly on the connection terminal by electrolytic plating so as to cover the connection terminal;
    a barrier layer formed by electrolytic plating so as to cover the under layer; and
    an external connection layer which is mainly composed of tin and formed on a surface of the barrier layer, wherein
    the barrier layer is made of alloy plating in which 3% to 15% of phosphorus is added to nickel, and the under layer is a made of copper or an alloy mainly composed of copper, and
    a film thickness of the under layer is 3 μm to 25 μm.

2. The electronic component according to claim 1, wherein a magnetic layer is formed between the connection terminal and the barrier layer.

* * * * *